(12) United States Patent
Wang et al.

(10) Patent No.: US 11,069,787 B2
(45) Date of Patent: Jul. 20, 2021

(54) GAN-BASED MICROWAVE POWER DEVICE WITH LARGE GATE WIDTH AND MANUFACTURING METHOD THEREOF

(71) Applicant: SOUTH CHINA UNIVERSITY OF TECHNOLOGY, Guangdong (CN)

(72) Inventors: Hong Wang, Guangdong (CN); Quanbin Zhou, Guangdong (CN)

(73) Assignee: SOUTH CHINA UNIVERSITY OF TECHNOLOGY, Guangdong (CN)

( * ) Notice: Subject to any disclaimer, the term of this patent is extended or adjusted under 35 U.S.C. 154(b) by 0 days.

(21) Appl. No.: 16/467,993

(22) PCT Filed: Aug. 29, 2018

(86) PCT No.: PCT/CN2018/102818
§ 371 (c)(1),
(2) Date: Jun. 10, 2019

(87) PCT Pub. No.: WO2019/100792
PCT Pub. Date: May 31, 2019

(65) Prior Publication Data
US 2020/0044040 A1    Feb. 6, 2020

(30) Foreign Application Priority Data
Nov. 21, 2017  (CN) .......................... 201711168295.3

(51) Int. Cl.
*H01L 29/66* (2006.01)
*H01L 29/423* (2006.01)
(Continued)

(52) U.S. Cl.
CPC ...... *H01L 29/4238* (2013.01); *H01L 29/2003* (2013.01); *H01L 29/41725* (2013.01); *H01L 29/66462* (2013.01); *H01L 29/7786* (2013.01)

(58) Field of Classification Search
CPC combination set(s) only.
See application file for complete search history.

(56) References Cited

U.S. PATENT DOCUMENTS

| 2009/0045438 A1* | 2/2009 | Inoue | H01L 29/0607 257/192 |
| 2009/0108357 A1* | 4/2009 | Takagi | H01L 29/4238 257/365 |

(Continued)

FOREIGN PATENT DOCUMENTS

| CN | 105244377 | 1/2016 |
| CN | 106298882 | 1/2017 |

(Continued)

OTHER PUBLICATIONS

"International Search Report (Form PCT/ISA/210) of PCT/CN2018/102818," dated Nov. 20, 2018, with English translation thereof, pp. 1-4.

*Primary Examiner* — Moin M Rahman
(74) *Attorney, Agent, or Firm* — JCIPRNET

(57) ABSTRACT

The present invention provides a GaN-based microwave power device with a large gate width and manufacturing method thereof. The device includes an AlGaN/GaN heterojunction epitaxial layer, a first dielectric layer overlying the AlGaN/GaN heterojunction epitaxial layer, a strip-like source electrode, a drain electrode distributed in a shape of a fishbone, an annular gate electrode, a second dielectric layer separating upper and lower electrodes, and an interconnect metal electrode pad. The GaN-based microwave power device with the large gate width prepared according to the present invention, has a small phase shift of the signals, a small parasitic capacitance of the device, a high signal gain, high power added efficiency and a high output (Continued)

power. At the same time, the manufacturing process of the device is simple, the chip area is saved, and the device has a good repeatability.

7 Claims, 6 Drawing Sheets

(51) Int. Cl.
*H01L 29/20* (2006.01)
*H01L 29/417* (2006.01)
*H01L 29/778* (2006.01)

(56) References Cited

U.S. PATENT DOCUMENTS

| | | | | |
|---|---|---|---|---|
| 2010/0052014 | A1* | 3/2010 | Matsushita | H01L 29/7787 257/192 |
| 2012/0119219 | A1* | 5/2012 | Takado | H01L 23/49562 257/76 |
| 2016/0190294 | A1* | 6/2016 | Okamoto | H01L 29/42368 257/194 |
| 2017/0330940 | A1* | 11/2017 | Lee | H01L 29/2003 |
| 2018/0096993 | A1* | 4/2018 | Jeon | H01L 27/088 |

FOREIGN PATENT DOCUMENTS

| | | |
|---|---|---|
| CN | 107799590 | 3/2018 |
| CN | 207611772 | 7/2018 |
| KR | 20160062795 | 6/2016 |

* cited by examiner

ND-BASED MICROWAVE POWER DEVICE
WITH LARGE GATE WIDTH AND
MANUFACTURING METHOD THEREOF

This application is a 371 of international application of PCT application serial no. PCT/CN2018/102818, filed on Aug. 29, 2018, which claims priority to and the benefit of China Patent Application No. 201711168295.3, filed on Nov. 21, 2017. The entirety of each of the above-mentioned patent applications is hereby incorporated by reference herein and made a part of this specification.

BACKGROUND

Technical Field

The present invention relates to the field of semiconductor device technology, and in particular to a GAN-based microwave power device with a large gate width and manufacturing method thereof, which can be used in the fields such as high frequency, high power wireless communication, radar, and so on.

Description of Related Art

With the development of modern weaponry, aerospace, nuclear power, communication technology, automotive electronics, and switching power supplies, higher requirements are placed on the performance of semiconductor devices. As a typical representative of wide bandgap semiconductor materials, GaN-based materials have characteristics such as a large width of bandgap, a high electron saturation drift velocity, high critical breakdown field strength, high thermal conductivity, good stability, corrosion resistance, radiation resistance, and so on, which can be used for fabricating high temperature, high frequency and high power electronic devices. In addition, GaN also has excellent electronic properties, and GaN together with AlGaN can form a modulation doped AlGaN/GaN heterostructure. The AlGaN/GaN heterostructure can obtain an electron mobility higher than 1500 cm2/Vs at room temperature, a peak electron velocity up to 3×107 cm/s, a saturation electron velocity of 2×107 cm/s, and can obtain a two-dimensional electron gas density higher than that of a second generation compound semiconductor heterostructure. which is known as the ideal material for the development of microwave power devices. Therefore, microwave power devices based on AlGaN/GaN heterojunction have very good application prospects in the fields such as high frequency, high power wireless communication, radar and so on.

The total output power of a GaN-based microwave power device is closely related to the gate width of the device. To increase the total power of the device, the gate width of the device has to be increased. However, the parasitic resistance will be increased if simply the width of a single gate finger is increased. Considering various factors such as saving chip area, improving yield, and reducing the phase shift of electrical signals, it is reasonable to adopt a multi-gate structure, that is, to use a plurality of gates having a smaller width to be combined as a larger gate width. Common multi-gate structures are parallel gate and fishbone-like gate. In a parallel gate structure, signals are input from the gate electrode, distributed to each gate finger, and was collected at a drain terminal after being amplified. There is a significant phase difference between the middle gate finger signal and the gate finger signals on both sides, causing a phase shift in the drain terminal signal. The more the number of gate fingers, the more serious this situation is, and the more the power added efficiency is reduced. In the fishbone-like gate structure, when the signal is transmitted to the farther a gate finger unit, the transmission path of the signal on the gate finger is increased, and the path for delivering out the drain electrode collecting signal is further reduced, and vice versa. Therefore, the total path of signal transmission is the same, and the total path traveled by each gate finger unit signal is the same. The phase shift of the signals between different gate fingers is greatly reduced, which increases the power added efficiency. At the same time, the gate finger of the fishbone-like gate structure is distributed towards both sides, which is more conducive to heat dissipation of the device. The disadvantage of the fishbone-like gate structure is that the air bridge of each drain terminal crosses over the gate and the source electrode, causing a large parasitic capacitance, resulting in a decrease in signal gain. On the whole, the parallel gate structure and the fishbone-like gate structure improve the total power of the device, meanwhile, they also bring about problems such as decreased power added efficiency and decreased signal gain and so on.

SUMMARY

The objective of the present invention is to overcome the defects of the prior art described above, and from the viewpoint of optimizing the gate finger distribution of the device, to propose a GAN-based microwave power device with a large gate width and manufacturing method thereof, thereby improving the total output power and efficiency of the device, reducing the chip area, reducing the difficulty of process, and improving yield.

The objective of the present invention is achieved by at least one of the following technical solutions.

A GaN-based microwave power device with a large gate width, includes an AlGaN/GaN heterojunction epitaxial layer, a first dielectric layer overlying the AlGaN/GaN heterojunction epitaxial layer, a strip-like source electrode, a drain electrode distributed in a shape of a fishbone, an annular gate electrode, a second dielectric layer separating upper and lower electrodes, and an interconnect metal electrode pad.

Further, the AlGaN/GaN heterojunction epitaxial layer includes a substrate, a nitride nucleation layer, a nitride buffer layer, a GaN channel layer, a AlGaN barrier layer from bottom to top; wherein a material of the substrate is sapphire, silicon or silicon carbide; the nitride nucleation layer is GaN or AlN; the nitride buffer layer is GaN, AlGaN, compositionally graded AlGaN or a combination of them; and a two-dimensional electron gas is provided between the GaN channel layer and the AlGaN barrier layer.

Further, the first dielectric layer overlying the AlGaN/GaN heterojunction epitaxial layer is one of SiN, SiO$_2$, SiON, Ga$_2$O$_3$, Al$_2$O$_3$, AlN, and HfO$_2$, or is a multilayer structure which is combined by them, and the first dielectric layer has a thickness of 10 nm to 50 nm.

Further, the source electrode and the drain electrode penetrate the entire first dielectric layer and are in contact with the AlGaN barrier layer. A material forming the source electrode and the drain electrode is a Ti/Al multilayer metal system, for example, Ti/Al/Ni/Au. The source electrode and the drain electrode are in ohmic contact with the AlGaN barrier layer by high temperature annealing.

Further, a plurality of strip-like source electrodes are distributed in parallel on a surface of the AlGaN/GaN heterojunction epitaxial layer to form a plurality of gate finger units.

Further, a plurality of drain electrodes are distributed in the shape similar to the fishbone on the surface of the AlGaN/GaN heterojunction epitaxial layer. Each fish bone (drain electrode) is parallel to the source electrode, and all of the drain electrodes are connected together by a fish ridge in the middle. Each drain electrode together with one source electrode forms one gate finger unit, and all of the drain electrodes and the source electrodes constitute a plurality of gate finger units.

Further, the gate electrode is located above the first dielectric layer, a bottom of the gate electrode being in contact with the first dielectric layer, the first dielectric layer being located between the gate electrode and the AlGaN/GaN heterojunction epitaxial layer. A material forming the gate electrode is a multilayer metal system with good conductivity, such as Ni/Au multilayer metal system and so on.

Further, the gate electrode is distributed between the source electrode and the drain electrode and surrounds the source electrode in a ring form. The gate electrode together with one source electrode and one drain electrode forms one gate finger unit.

Further, the second dielectric layer is located above the first dielectric layer and overlies the source electrode, the drain electrode and the gate electrode, and a material of the second dielectric layer is one of SiN, $SiO_2$ and SiON or is a multilayer structure which is combined by them, the second dielectric layer having a thickness of 300 nm to 500 nm.

Further, the second dielectric layer above a partial region of the source electrode, the drain electrode and the gate electrode is removed to form through holes, shapes of the through holes being one of a square, a rectangle, and a circle, and widths of the through holes not exceeding sizes of the electrodes below the through holes, i.e., areas of the through holes being smaller than areas of the electrodes.

Further, the interconnect metal electrode pad is respectively connected the source electrode, the drain electrode and the gate electrode through the through holes in the second dielectric layer, and respectively forms a source electrode, a drain electrode, and a gate electrode which are used for device testing and packaging. A material of the interconnect metal electrode pad is a multilayer metal system which has good electrical conductivity and is stable in air and difficult to be oxidized in surface, such as Ti/Al/Au multilayer metal system and so on.

Further, when the interconnect metal electrode pad is connected to the source electrode, the second dielectric layer is used as a dielectric bridge, and crosses over the gate electrode and the drain electrode.

A preparation method of the GaN-based microwave power device with the large gate width, the preparation method includes the steps of:

1) epitaxial process: epitaxially growing a nitride nucleation layer, a nitride buffer layer, a GaN channel layer, and an AlGaN barrier layer on a substrate in sequence and forming an AlGaN/GaN heterojunction epitaxial layer, by a metal organic vapor deposition method;

2) devices isolation: defining the active region by photolithography process, using a photoresist to overlie and protect an active region, and utilizing ICP etching to remove the AlGaN/GaN heterojunction outside the active region, and an depth of etching being greater than the AlGaN barrier layer, removing the AlGaN barrier layer and a portion of the GaN channel layer to achieve isolation between different devices;

3) dielectric deposition process: depositing the first dielectric layer on the AlGaN/GaN heterojunction epitaxial layer, wherein the material of the first dielectric layer is one of SiN, $SiO_2$, SiON, $Ga_2O_3$, $Al_2O_3$, AlN, $HfO_2$, or the multilayer structure which is combined by them, and the first dielectric layer has the thickness of 10 nm to 50 nm; and the deposition manner of the first dielectric layer is one of metal organic chemical vapor deposition (MOCVD), plasma enhanced chemical vapor deposition (PECVD), and low pressure chemical vapor deposition (LPCVD);

4) gate electrode process: depositing a gate electrode metal film on the first dielectric layer by means of electron beam evaporation or magnetron sputtering, a material of the gate electrode metal film being a multilayer metal system with good conductivity, such as Ni/Au multilayer metal system and so on; and defining a pattern of the gate electrode on the metal film by electron beam exposure process, etching the gate electrode metal film by means of ICP or RIE, removing the photoresist, and remaining the gate electrode;

5) source and drain electrode process: defining patterns of the source electrode and the drain electrode on the metal film by negative photoresist photolithography process; completely etching and removing the first dielectric layer at positions of the patterns of the source electrode and the drain electrode by ICP; depositing a source and drain electrode metal film by means of electron beam evaporation or by means of magnetron sputtering, a material of the metal film being a Ti/Al multilayer metal system such as Ti/Al/Ni/Au; then forming the source electrode and the drain electrode by lift-off process; placing a sample under a nitrogen atmosphere and annealing the sample at a temperature higher than 800 degrees centigrade for 30 s, such that the source and drain electrode metal are in ohmic contact with the AlGaN/GaN heterojunction epitaxial layer;

6) dielectric deposition: depositing the second dielectric layer over the first dielectric layer and completely overlying the source electrode, the drain electrode and the gate electrode; wherein the material of the second dielectric layer is one of SiN, $SiO_2$, SiON, or is the multilayer structure which is combined by them; the second dielectric layer has the thickness of 10 nm to 50 nm; and the deposition manner of the second dielectric layer is plasma enhanced chemical vapor deposition (PECVD);

7) through hole etching process: on the second dielectric layer, defining a pattern of the through holes corresponding to the positions of the source electrode, the drain electrode and the gate electrode by photolithography process; and utilizing ICP to etch the material of the second dielectric layer at the positions of the through holes such that the second dielectric layer at the positions of the through holes is completely removed and the electrodes below are exposed;

8) interconnect metal pad: defining a pattern of the interconnect metal pad by photolithography process; depositing the interconnect metal by electron beam evaporation; the material of the interconnect metal electrode pad is the multilayer metal system which has good electrical conductivity and is stable in air and difficult to be oxidized in surface, such as Ti/Al/Au multilayer metal system and so on.

The sequence of the gate electrode process and the source and drain electrode process are interchangeable.

Compared with the prior art, the present invention has following advantages and technical effects.

The device is a GaN-based high electron mobility transistor based on AlGaN/GaN heterojunction. which forms a large gate width device structure of the fishbone-like drain electrode by optimizing the gate finger distribution, and avoids the problems such the phase shift of the electrical signal, the parasitic capacitance and so on, in the traditional multi-finger gate structures such as parallel gate and fishbone-like gate and so on. The device has a high signal gain, a high power added efficiency, and a high output power. At the same time, the manufacturing process of the device is simple, the chip area is saved, and the device has a good repeatability. The GaN-based microwave power device with the large gate width of the present invention is suitable for the fields such as high frequency, high power wireless communication, radar and so on.

DESCRIPTION OF THE EMBODIMENTS

The specific implementation of the present invention is further described below with reference to the accompanying drawings and embodiment, but the implementation and protection of the present invention are not limited thereto. It should be noted that, if any course or process parameters are not described in detail below, it can be achieved with reference to the prior art by those skilled in the art.

Figure 1:
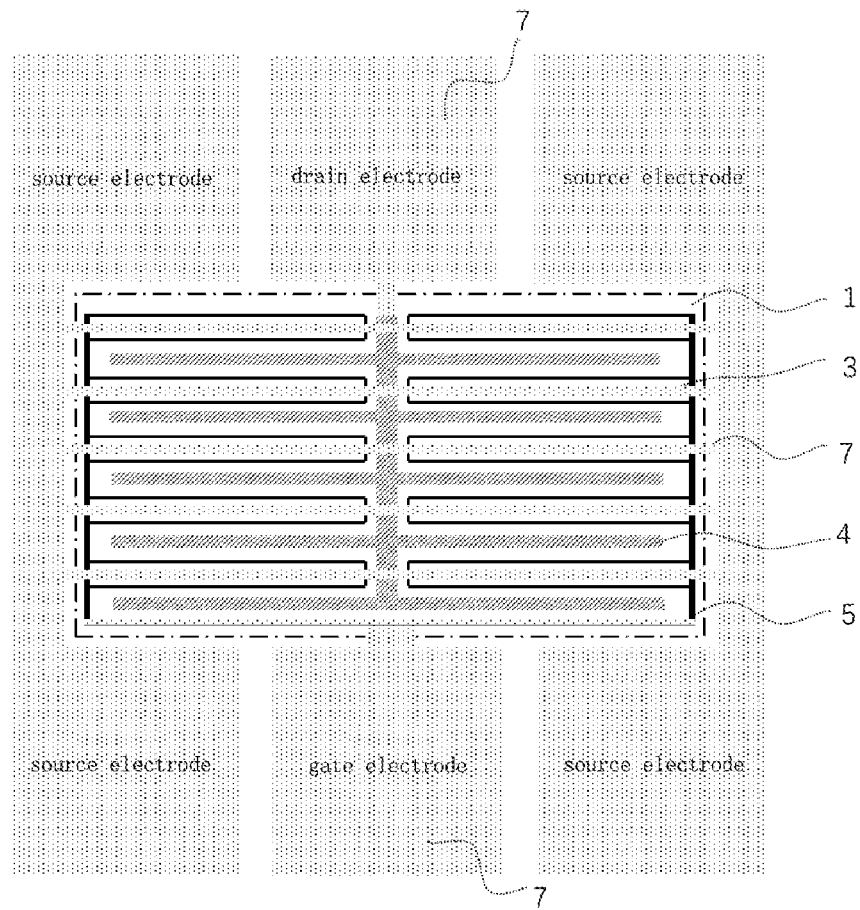
FIG. 1 is a top schematic view of a GAN-based microwave power device with a large gate width according to the present invention.

Referring to FIG. 1, a GAN-based microwave power device with a large gate width, includes: an AlGaN/GaN heterojunction epitaxial layer 1, a first dielectric layer 2 overlying the AlGaN/GaN heterojunction epitaxial layer, a strip-like source electrode 3, a drain electrode 4 distributed in a shape of a fishbone, a annular gate electrode 5, a second dielectric layer 6 separating upper and lower electrodes, and a interconnect metal electrode pad 7.

The AlGaN/GaN heterojunction epitaxial layer includes a substrate, a nitride nucleation layer, a nitride buffer layer, a GaN channel layer, a AlGaN barrier layer from bottom to top; wherein a material of the substrate is sapphire; the nitride nucleation layer is GaN; the nitride buffer layer is GaN; and a two-dimensional electron gas is provided between the GaN channel layer and the AlGaN barrier layer. The first dielectric layer 2 is SiN and has a thickness of 30 nm. The source electrode 3 and the drain electrode 4 penetrate the entire first dielectric layer and are in contact with the AlGaN barrier layer. A material forming the source electrode and the drain electrode is Ti/Al/Ni/Au=20/100/10/50 nm. The source electrode 3 and the drain electrode 4 are in ohmic contact with the AlGaN barrier layer by high temperature annealing. A plurality of strip-like source electrodes 3 are distributed in parallel on a surface of the AlGaN/GaN heterojunction epitaxial layer to form a plurality of gate finger units. Further, a plurality of drain electrodes 4 are distributed in the shape similar to the fishbone on the surface of the AlGaN/GaN heterojunction epitaxial layer. Each fish bone (drain electrode) is parallel to the source electrode 3, and all of the drain electrodes 4 are connected together by a fish ridge in the middle. Each drain electrode 4 together with one source electrode 3 forms one gate finger unit, and all of the drain electrodes 4 and the source electrodes 3 constitute a plurality of gate finger units. The gate electrode 5 is located above the first dielectric layer 2, a bottom of the gate electrode 5 being in contact with the first dielectric layer 2, and the first dielectric layer is located between the gate electrode and the AlGaN/GaN heterojunction epitaxial layer 1. A material forming the gate electrode is Ni/Au=50/50 nm. The gate electrode is distributed between the source electrode and the drain electrode, and surrounds the source electrode in a ring form. The gate electrode together with one source electrode and one drain electrode forms one gate finger unit. The second dielectric layer 6 is located above the first dielectric layer 2 and overlies the source electrode 3, the drain electrode 4 and the gate electrode 5, and a material of the second dielectric layer 6 is SiN. The second dielectric layer 6 has a thickness 500 nm. The second dielectric layer 6 above a partial region of the source electrode 3, the drain electrode 4 and the gate electrode 5 is removed to form through holes 8. A Shape of the through holes 8 is a square, and widths of the through holes 8 does not exceeds sizes of the electrodes below the through holes 8, i.e., areas of the through holes 8 is smaller than areas of the electrodes. The interconnect metal electrode pad 7 is respectively connected the source electrode 3, the drain electrode 4 and the gate electrode 5 through the through holes 8 in the second dielectric layer 6, and respectively forms a source electrode, a drain electrode, and a gate electrode which are used for device testing and packaging. A material of the interconnect metal electrode pad is Ti/Al/Au=50/450/50 nm. When the interconnect metal electrode pad is connected to the source electrode, the second dielectric layer is used as a dielectric bridge, and crosses over the gate electrode and the drain electrode.

Just for an example, as shown in FIG. 2a to FIG. 2l, the specific implementation steps are as follows.

Figure 2A:
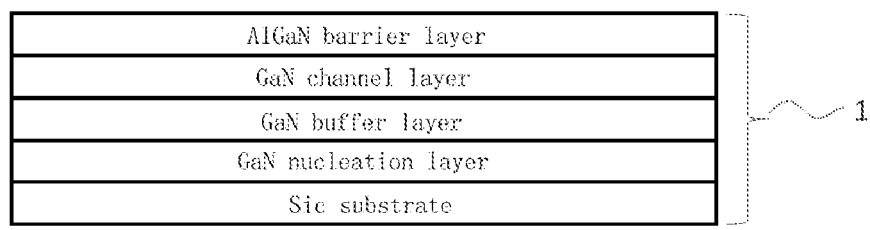
FIGS. 2a to 2l are schematic views showing preparation process of the GAN-based microwave power device with the large gate width in an embodiment of the present invention.

Step 1, epitaxial process. As shown in FIG. 2a, A nitride nucleation layer, a nitride buffer layer, a GaN channel layer, and an AlGaN barrier layer is epitaxially grown on a substrate in sequence and an AlGaN/GaN heterojunction epitaxial layer 1 is formed, by a metal organic chemical vapor deposition (MOVCD) method.

Figure 2B:
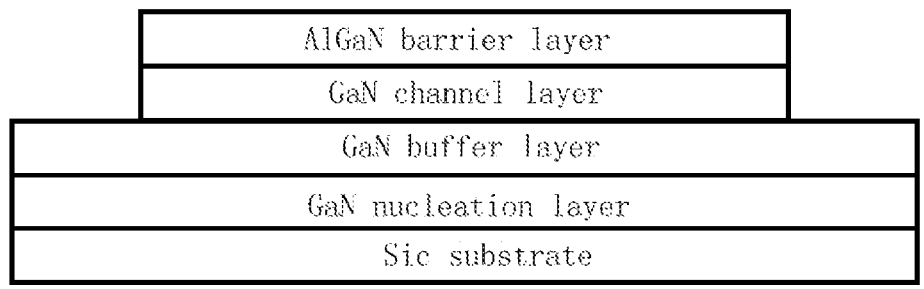

Step 2, devices isolation. As shown in FIG. 2b, the active region is defined by photolithography process, a photoresist is used to overlie and protect an active region. The AlGaN/GaN heterojunction outside the active region is removed utilizing ICP etching. An depth of the etching is 200 nm, which greater than the AlGaN barrier layer. The AlGaN barrier layer and a portion of the GaN channel layer is removed to achieve isolation between different devices.

Figure 2C:
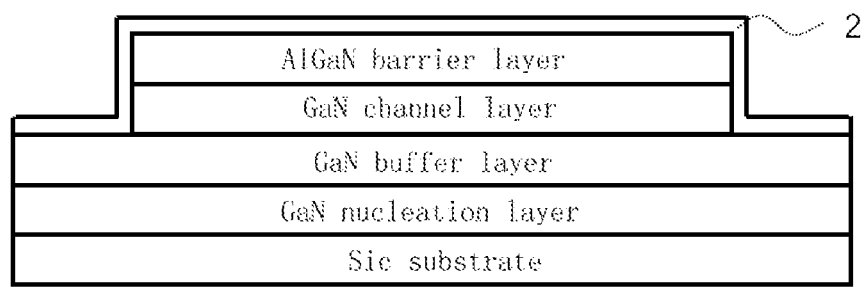

Step 3, dielectric deposition process. As shown in FIG. 2c, the first dielectric layer 2 is deposited on the AlGaN/GaN heterojunction epitaxial layer. A material of the first dielectric layer 2 is SiN and the first dielectric layer 2 has the thickness of 30 nm; and the deposition manner of the first dielectric layer 2 is low pressure chemical vapor deposition (LPCVD).

Figure 2D:
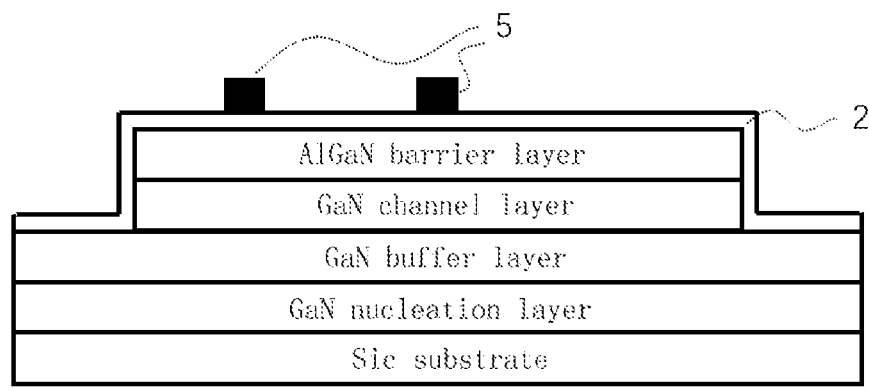
Figure 2E:
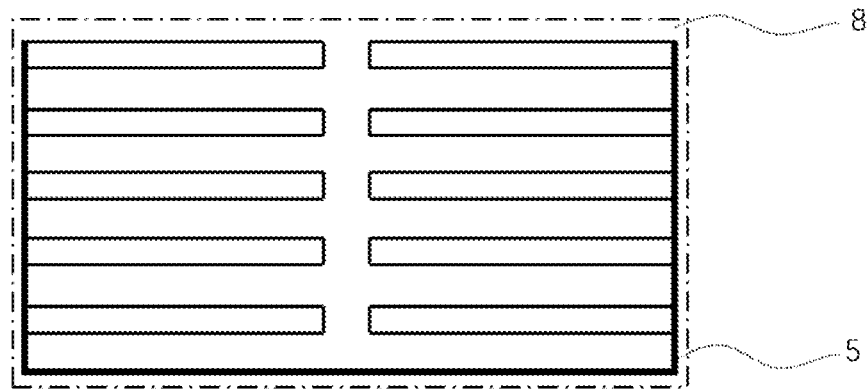

Step 4, gate electrode process. As shown in FIG. 2d, a gate electrode metal film is deposited on the first dielectric layer by electron beam evaporation, and A material of the metal is Ni/Au=50/50 nm. A pattern of the gate electrode on the metal film by electron beam exposure process. The gate electrode metal film is etched by means of ICP and then the photoresist is removed to form the gate electrode 5. The distribution of the gate electrode 5 is as shown in FIG. 2e.

Step 5, source and drain electrode process. The patterns of the source electrode and the drain electrode is defined on the first dielectric layer 2 by negative photoresist photolithography process. The first dielectric layer 2 at positions of the patterns of the source electrode and the drain electrode are completely etched and removed by fluorine-based ion etching using ICP. A source and drain electrode metal film is deposited by means of electron beam evaporation, and the material of the metal is a Ti/Al/Ni/Au=20/100/10/50 nm.

Figure 2F:
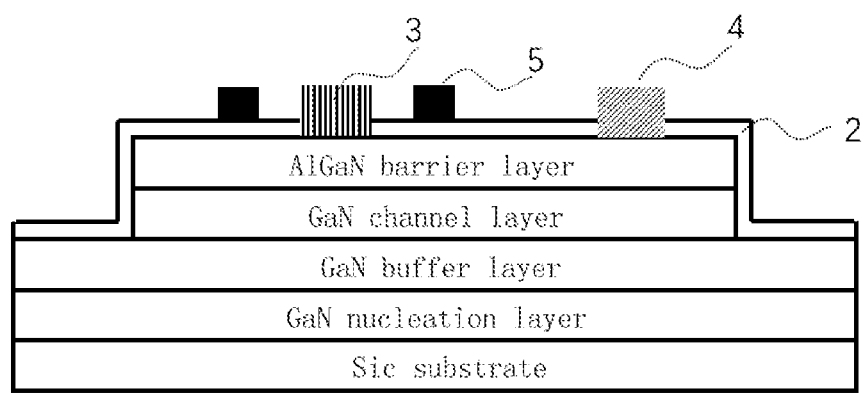
Figure 2G:
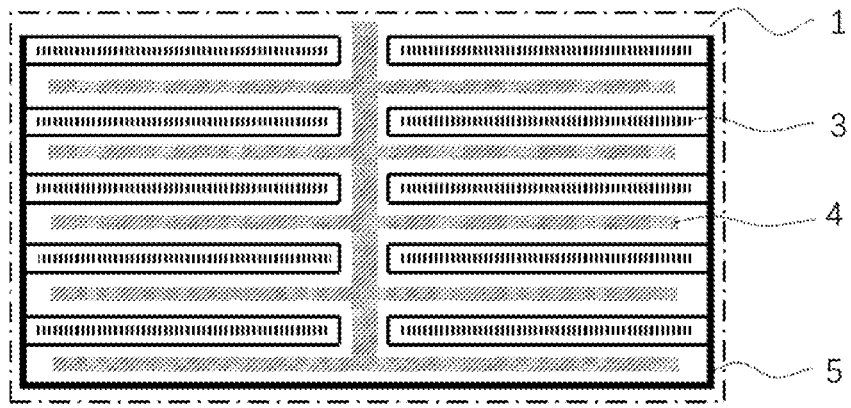

Then, as shown in FIG. 2f, the source electrode 3 and the drain electrode 4 are formed by lift-off process. A sample was placed under a nitrogen atmosphere and annealed at 850 degrees centigrade for 30 s, such that the source and drain electrode metal are in ohmic contact with the AlGaN/GaN heterojunction epitaxial layer 1. The distribution of the source electrode 3 and the drain electrode 4 is as shown in FIG. 2g.

Figure 2H:
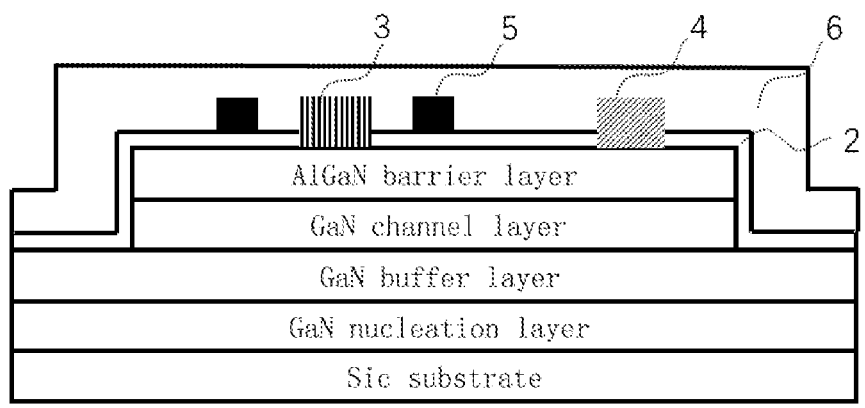

Step 6, dielectric deposition. As shown in FIG. 2h, the second dielectric layer 6 is deposited over the first dielectric layer 2 and completely overlies the source electrode 3, the drain electrode 4 and the gate electrode 5. The material of the second dielectric layer 6 is SiN, and the second dielectric layer 6 has the thickness of 500 nm. The deposition manner of the second dielectric layer 6 is plasma enhanced chemical vapor deposition (PECVD).

Figure 2I:
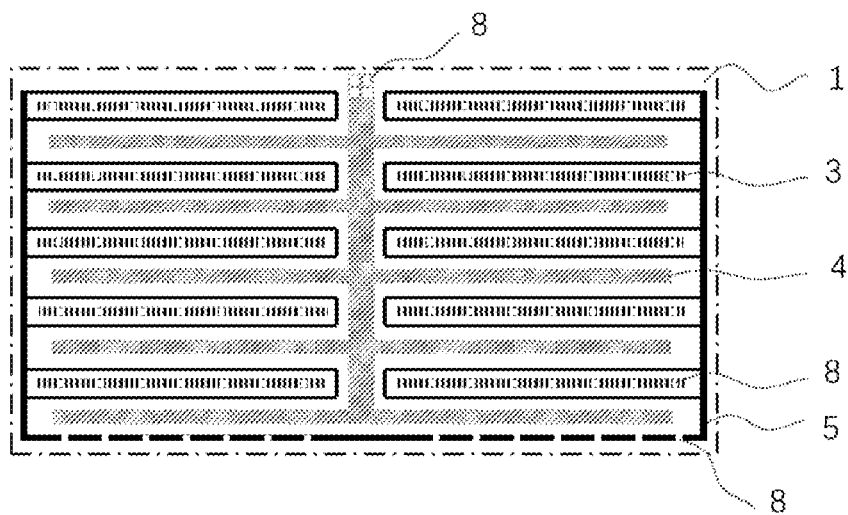
Figure 2J:
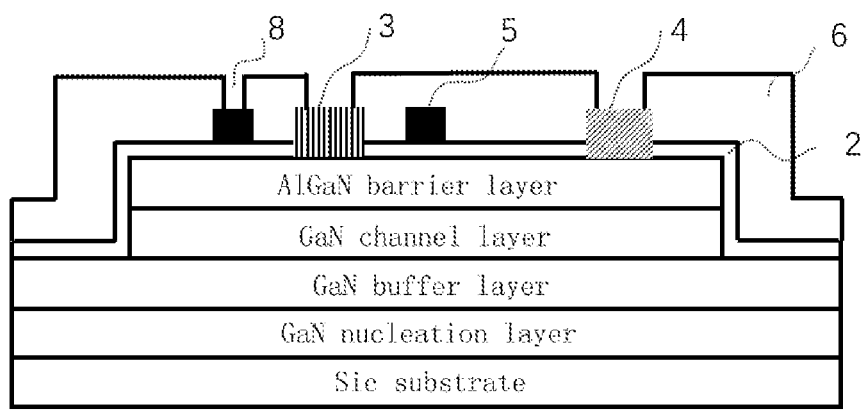

Step 7, through hole etching process. On the second dielectric layer 6, a pattern of the through holes 8 is defined corresponding to positions of the source electrode 3, the drain electrode 4 and the gate electrode 5 by photolithography process, wherein there is the pattern of the through holes 8 on each the source electrode 3; there is the pattern of the through holes 8 on the drain electrode 4 at the fish ridge; and there is the pattern of the through holes 8 on the gate electrode 5 on a outermost ring, and the distribution of the through holes 8 are as shown in FIG. 2i. As shown in FIG. 2j, the material of the second dielectric layer 6 at the positions of the through holes 8 are etched by fluorine-based ion using ICP, such that the second dielectric layer 6 at the positions is completely removed and the electrodes below are exposed.

Figure 2K:
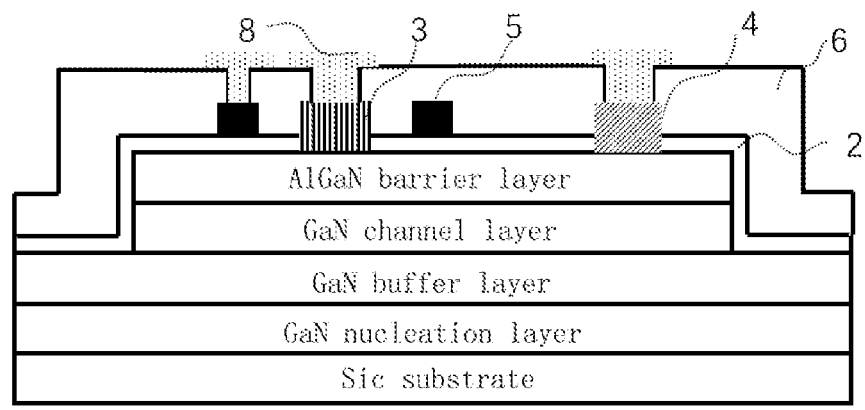
Figure 2L:
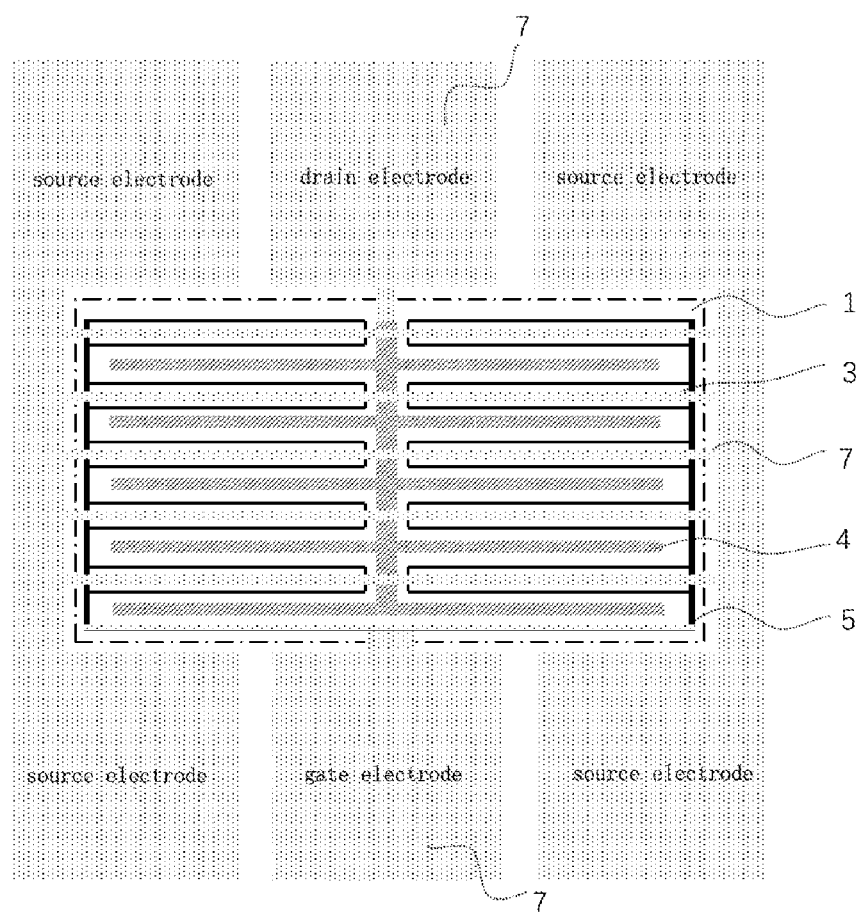

Step 8, interconnect metal pad. A pattern of the interconnect metal pad pattern is defined by photolithography process. The interconnect metal Ti/Al/Au=50/450/50 nm is deposited by electron beam evaporation, and then the interconnect metal pad 7 is formed by lift-off process. The pattern of the interconnect metal pad 7 is as shown in FIG. 2k.

The device is a GaN-based high electron mobility transistor based on AlGaN/GaN heterojunction. which forms a large gate width device structure of the fishbone-like drain electrode by optimizing the gate finger distribution, and avoids the problems such the phase shift of the electrical signal, the parasitic capacitance and so on, in the traditional multi-finger gate structures such as parallel gate and fishbone-like gate and so on. The device has a high signal gain, a high power added efficiency, and a high output power. At the same time, the manufacturing process of the device is simple, the chip area is saved, and the device has a good repeatability. The GaN-based microwave power device with the large gate width of the present invention is suitable for the fields such as high frequency, high power wireless communication, radar and so on.

The embodiment described above is merely preferred embodiment of the present invention, and are not intended to limit the scope of the present invention. It is obvious to those skilled in the art that various modifications and changes in form and detail can be made according to the method of the present invention without departing from the principles and scope of the present invention, after understanding the contents and principles of the present invention. However, such modifications and changes based on the present invention still fall within the protection scope of the claims of the present invention.

What is claimed is:

1. A GaN-based microwave power device with a large gate width, wherein the device comprises:

an AlGaN/GaN hetero unction epitaxial layer; a first dielectric layer overlying the AlGaN/GaN heterojunction epitaxial layer; a strip-like source electrode; a drain electrode distributed in a shape of a fishbone, wherein the drain electrode comprises a first drain electrode located at a fish ridge of the fishbone and a plurality of second drain electrodes located at fish bones of the fishbone, and all of the second drain electrodes are connected together by the first drain electrode in a middle;

a plurality of annular gate electrodes, wherein the gate electrodes are disposed on two sides of the first drain electrode in a symmetrical manner, and the gate electrodes disposed on one side of the first drain electrode are arranged along an extending direction of the first drain electrode;

a second dielectric layer; and an interconnect metal electrode pad, wherein the second dielectric layer separates the gate electrodes and a portion of the interconnect metal electrode pad which connects the source electrode, and the second dielectric layer separates the drain electrode and the portion of the interconnect metal electrode pad, wherein the first dielectric layer overlying the AlGaN/GaN heterojunction epitaxial layer is one of SiN, $SiO_2$, SON, $Ga_2O_3$, $Al_2O_3$, AlN, and HfO2, or is a multilayer structure which is combined by two or more of them, and the first dielectric layer has a thickness of 10 nm to 50 nm.

2. The GaN-based microwave power device with the large gate width according to claim 1, wherein the AlGaN/GaN heterojunction epitaxial layer comprises a substrate, a nitride nucleation layer, a nitride buffer layer, a GaN channel layer, a AlGaN barrier layer from bottom to top; wherein a material of the substrate is sapphire, silicon or silicon carbide; the nitride nucleation layer is GaN or AlN; the nitride buffer layer is one or more of GaN, AlGaN, compositionally graded AlGaN; and a two-dimensional electron gas is provided between the GaN channel layer and the AlGaN barrier layer.

3. The GaN-based microwave power device with the large gate width according to claim 1, wherein the source electrode and the drain electrode penetrate the entire first dielectric layer and are in contact with the AlGaN barrier layer; and a material forming the source electrode and the drain electrode is a Ti/Al multilayer metal system; the source electrode and the drain electrode are in ohmic contact with the AlGaN barrier layer by high temperature annealing.

4. The GaN-based microwave power device with the large gate width according to claim 1, wherein a plurality of strip-like source electrodes are distributed in parallel on a surface of the AlGaN/GaN heterojunction epitaxial layer to form a plurality of gate finger units; the drain electrode is distributed on the surface of the AlGaN/GaN heterojunction epitaxial layer, each second drain electrode is parallel to the source electrode, and each second drain electrode together with one source electrode forms one gate finger unit, and all of the second drain electrodes and the source electrodes constitute a plurality of gate finger units.

5. The GaN-based microwave power device with the large gate width according to claim 1, wherein the gate electrodes are located above the first dielectric layer, a bottom of the gate electrodes is in contact with the first dielectric layer, the first dielectric layer is located between the gate electrodes and the AlGaN/GaN heterojunction epitaxial layer; a material forming the gate electrodes is a Ni/Au multilayer metal system with good conductivity; each gate electrode is distributed between the source electrode and the drain electrode and surrounds the source electrode in a ring form; the second dielectric layer is located above the first dielectric layer and overlies the source electrode, the drain electrode and the gate electrodes, and a material of the second dielectric layer is one of SiN, SiO$_2$ and SiON or is a multilayer structure which is combined by two or more of them, the second dielectric layer has a thickness of 300 nm to 500 nm.

6. The GaN-based microwave power device with the large gate width according to claim 1, wherein the second dielectric layer above a partial region of the source electrode, the drain electrode and the gate electrodes is removed to form through holes, shapes of the through holes is one of a square, a rectangle, and a circle, and widths of the through holes not exceeding sizes of the partial region of the source electrode, the drain electrode and the gate electrodes, and areas of the through holes is smaller than areas of the partial region of the source electrode, the drain electrode and the gate electrodes.

7. The GaN-based microwave power device with the large gate width according to claim 6, wherein the interconnect metal electrode pad is respectively connected the source electrode, the drain electrode and the gate electrodes through the through holes in the second dielectric layer, and respectively forms a source electrode, a drain electrode, and a gate electrode which are used for device electrical performance testing and packaging; when the interconnect metal electrode pad is connected to the source electrode, the second dielectric layer is used as a dielectric bridge, and crosses over the gate electrode and the drain electrode.

* * * * *